(12) United States Patent
Lu

(10) Patent No.: US 10,014,867 B1
(45) Date of Patent: Jul. 3, 2018

(54) LOW-JITTER PHASE-LOCKED LOOP CIRCUIT

(71) Applicant: AUCMOS Technologies USA, Inc., Santa Clara, CA (US)

(72) Inventor: Teh-Shang Lu, Sunnyvale, CA (US)

(73) Assignee: AUCMOS Technologies USA, Inc., Santa Clara, CA (US)

( * ) Notice: Subject to any disclaimer, the term of this patent is extended or adjusted under 35 U.S.C. 154(b) by 0 days.

(21) Appl. No.: 15/391,970

(22) Filed: Dec. 28, 2016

(51) Int. Cl.
  *H03L 7/093* (2006.01)
  *H03L 7/089* (2006.01)

(52) U.S. Cl.
  CPC .......... *H03L 7/0891* (2013.01); *H03L 7/0893* (2013.01); *H03L 7/093* (2013.01)

(58) Field of Classification Search
  CPC .................. H03L 7/089–7/0893; H03L 7/093
  See application file for complete search history.

(56) References Cited

U.S. PATENT DOCUMENTS

| | | | | |
|---|---|---|---|---|
| 7,091,759 B2* | 8/2006 | Sowlati | .............. | H03L 7/0893 327/156 |
| 7,345,550 B2* | 3/2008 | Bellaouar | .............. | H03L 7/0893 331/16 |
| 7,595,671 B2* | 9/2009 | Watanabe | .............. | H03L 7/0893 327/147 |
| 7,782,144 B2* | 8/2010 | Hasegawa | .............. | H03L 7/093 327/157 |
| 8,040,191 B2* | 10/2011 | Hirai | .............. | H03L 7/0893 327/156 |
| 8,274,325 B2* | 9/2012 | Lamanna | .............. | H03L 7/0893 327/156 |
| 8,278,984 B2* | 10/2012 | Lamanna | .............. | H03L 7/0893 327/156 |
| 8,558,592 B2* | 10/2013 | Sreekiran | .............. | H03L 7/0893 327/157 |
| 8,810,292 B2* | 8/2014 | Katsushima | .............. | H03L 7/06 327/148 |

\* cited by examiner

*Primary Examiner* — Patrick O'Neill
(74) *Attorney, Agent, or Firm* — VLP Law Group, LLP; Edward C. Kwok, Esq.

(57) ABSTRACT

A phase-locked loop circuit includes (a) a phase frequency detector which receives the input signal of the phase-locked loop and a feedback signal that is derived from the output signal of the phase-locked loop, the phase-frequency detector providing a phase-difference signal indicating a difference in phase or frequency between the input signal and the feedback signal; (b) a voltage control oscillator which receives a voltage control signal and which provide the output signal of the phase-locked loop according to the voltage control signal; (c) first and second charge pump-filter circuits each receiving the phase difference signal and each comprising: (i) a charge pump circuit which provide a predetermined signal in accordance with the phase difference signal; and (ii) a filter circuit receiving the predetermined signal to provide a filtered signal, the filter circuit comprising one or more resistors and one or more capacitors; and (d) a summing circuit which sums the filtered signal of the first charge pump-filter circuit and the filtered signal of the second charge pump-filter circuit to provide the voltage control signal.

5 Claims, 4 Drawing Sheets

LOW-JITTER PHASE-LOCKED LOOP CIRCUIT

BACKGROUND OF THE INVENTION

1. Field of the Invention

The present invention relates to circuit designs. Specifically, the present invention relates to on-chip phase-lock loop circuits in an integrated circuit.

2. Discussion of the Related Art

Phase-locked loop circuits are used in many integrated circuit for data communication when the communicating parties are synchronized by the same clock signal. For example, in one telecommunication circuit transmitting data at a rate of 10-50 Gbits per second, 64 bit-serial data channels are used. Each channel may be sampled using a phase-locked loop. The phase-locked detects the timing of signal transitions in an input signal, so as to allow the sampling circuit to sample the value of the signal during the time interval between signal transitions. A low-jitter phase-locked loop is highly desirable, as any jitter in the time interval detected by the phase-locked loop would diminish the window of time during which data can be reliably sampled.

FIG. 1 shows a block diagram of a phase-locked loop 100. As shown in FIG. 1, phase-locked loop 100 includes phase frequency detector 101, charge pump circuit 102, loop filter detector 103, voltage-controlled oscillator 105 and divider 105. Phase frequency detector 101 receives input signal 116 ("VIN") and compares it against feedback signal 115, which is a signal that represents a current prediction of the timing in input signal 116 at current time. Phase frequency detector 101 provides the result of the comparison in detected phase signal 112, which indicates either (i) input signal 116 leads feedback signal 115, or (ii) input signal 116 lags feedback signal 115. The goal is to have feedback signal 115 track input signal 116. Therefore, when input signal 116 leads feedback signal 115, the frequency of feedback signal 115 need to be increased ("sped up"); conversely, when input signal 116 lags feedback signal 115, the frequency of feedback signal 115 needs to be decreased ("slowed down"). Detected phase signal 112 controls charge pump circuit 102 to initiate speeding up or slowing down feedback signal 115. Charge pump circuit 102, through loop filter 103, increases or decreases the voltage ("VcNTL") at input signal 114 of voltage-controlled oscillator 104, depending on whether feedback signal 115 is to be sped up or to be slowed down. Loop filter circuit 103 serves primarily as a low-pass filter. Voltage-controlled oscillator 104 increases its output frequency when voltage $V_{CNTL}$ of input signal 114 is increased and decreases its output frequency when voltage $V_{CNTL}$ of input signal 114 is decreased. Output signal 111 ("$V_{OUT}$") of voltage-controlled oscillator —which may also serves as the output signal of phase-locked loop 100—is typically a signal that is designed to have a higher frequency than input signal 116. Feedback signal 115 is derived from dividing down output signal 111 by a known multiple.

FIG. 2 shows one conventional implementation 200 of charge pump circuit 102 and loop filter circuit 103. As shown in FIG. 2, charge pump circuit 102 includes current sources 201 and 202, and loop filter circuit 103 includes an RC filter circuit represented by resistors 203 and 206 (with resistance values $R_1$ and $R_2$, respectively), and capacitors 204, 205 and 207 (with capacitance values $C_1$, $C_2$, and $C_3$, respectively). Current sources 201 and 202 provide currents $I_P$ and $-I_P$, respectively. The transfer function of loop filter 103 in implementation 200 is given by:

$$H(s) = \frac{I_{CP} * (1 + sR_1C_1)}{sC_1(1 + sR_1C_2)(1 + sR_2C_3)}$$

where $I_{CP}$ is the charge pump current input into loop filter 103. Thus, there is one zero at $$\omega_Z = \frac{1}{R_1 C_1},$$

and three poles at $$\omega_{p1} = 0, \omega_{p2} = \frac{-1}{R_1 C_2},$$

and $$\omega_{p3} = \frac{-1}{R_2 C_3},$$

respectively.

When detected phase signal 112 indicates that feedback signal 115 is to be sped up (i.e., voltage $V_{CNTL}$ at input signal 114 of voltage-controlled oscillator 104 is be increased), current source 201 is turned on to cause a current $I_P$ to flow into loop filter circuit 103, which charges capacitors 204, 205 and 207. Conversely, when detected phase signal 112 indicates that feedback signal 115 is to be slowed down (i.e., voltage $V_{CNTL}$ at input signal 114 of voltage-controlled oscillator 104 is be decreased), current source 202 is turned on to cause a current $-I_P$ to flow out of loop filter circuit 103, which discharges capacitors 204, 205 and 207. (There are many ways to turn on current source 201 or current source 202, or to allow the current from either current source to flow into or out of loop filter 103. To simplify this description, a detailed discussion of such ways, being conventional techniques known to those of ordinary skill in the art, is omitted). Typical resistance values $R_1$ and $R_2$ are each 10 kΩ, a typical values for $C_1$ is 100 pF, and typical values for $C_2$, and $C_3$ are each 10 pF. Thus, $R_1C_1$ provides the largest RC time constant in this network.

In implementation 200, noise in voltage-controlled oscillator 104 and noise in loop filter 103 result in jitter in output signal 111 of phase-locked loop 100. In the prior art, to reduce jitter, the bandwidth of the phase-locked loop is made large. The cut-off frequency $\omega_z$ of loop filter 103 is roughly given, for example, by:

$$\omega_Z = \frac{1}{2\pi R_1 C_1}$$

In an integrated circuit implementation, a practical largest capacitance value for $C_1$ is in the order of 100 pF. In that regard, a value for $R_1$ that is needed to achieve a bandwidth of 1 Mhz would require an undesirably large silicon area to implement in an integrated circuit.

SUMMARY

According to one embodiment of the present invention, a phase-locked loop circuit includes (a) a phase frequency detector which receives the input signal of the phase-locked loop and a feedback signal that is derived from the output signal of the phase-locked loop, the phase-frequency detector providing a phase-difference signal indicating a difference in phase or frequency between the input signal and the feedback signal; (b) a voltage control oscillator which receives a voltage control signal and which provide the output signal of the phase-locked loop according to the voltage control signal; (c) first and second charge pump-filter circuits each receiving the phase difference signal and each comprising: (i) a charge pump circuit which provide a predetermined signal in accordance with the phase difference signal; and (ii) a filter circuit receiving the predetermined signal to provide a filtered signal, the filter circuit comprising one or more resistors and one or more capacitors; and (d) a summing circuit which sums the filtered signal of the first charge pump-filter circuit and the filtered signal of the second charge pump-filter circuit to provide the voltage control signal.

In a phase-locked loop circuit of the present invention, each of the charge pump-filter circuits may include a charge pump having a first current source that provides a predetermined current from a power supply voltage source and a second current source that sinks a predetermined to a ground voltage. The first and second charge-pump-filter circuit and the summing circuit together implement a transfer function of a conventional charge pump circuit and a conventional loop filter circuit.

According to one embodiment of the present invention, in the phase-locked loop circuit, the first and second charge-pump-filter circuit and the summing circuit together implement a transfer function that has at least a zero of:

$$H(s) = \frac{(1 + sR_1C_1)}{(s^2C_2C_3 + sC_1)(1 + sR_2C_3)}$$

The summing circuit may be implemented by a voltage mode summing circuit or a current mode summing circuit.

The present invention is better understood upon consideration of the detailed description below in conjunction with the accompanying drawings.

DETAILED DESCRIPTION OF THE PREFERRED EMBODIMENTS

Figure 2:
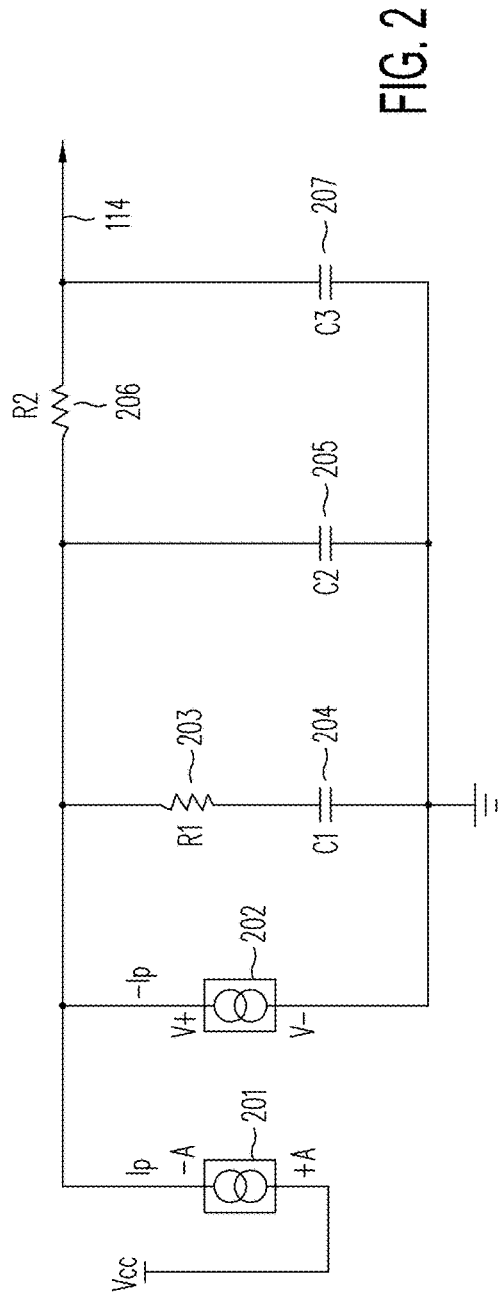
FIG. 2 shows one conventional implementation 200 of charge pump circuit 102 and loop filter circuit 103.

The inventors the network of implementation 200 in FIG. 2 may be decomposed into two networks which output voltages may be summed to achieve an equivalent transfer function of a conventional loop filter. One example of such an equivalent transfer function is:

$$H(s) = \frac{(1 + sR_1C_1)}{(s^2C_2C_3 + sC_1)(1 + sR_2C_3)}$$

Figure 3A:
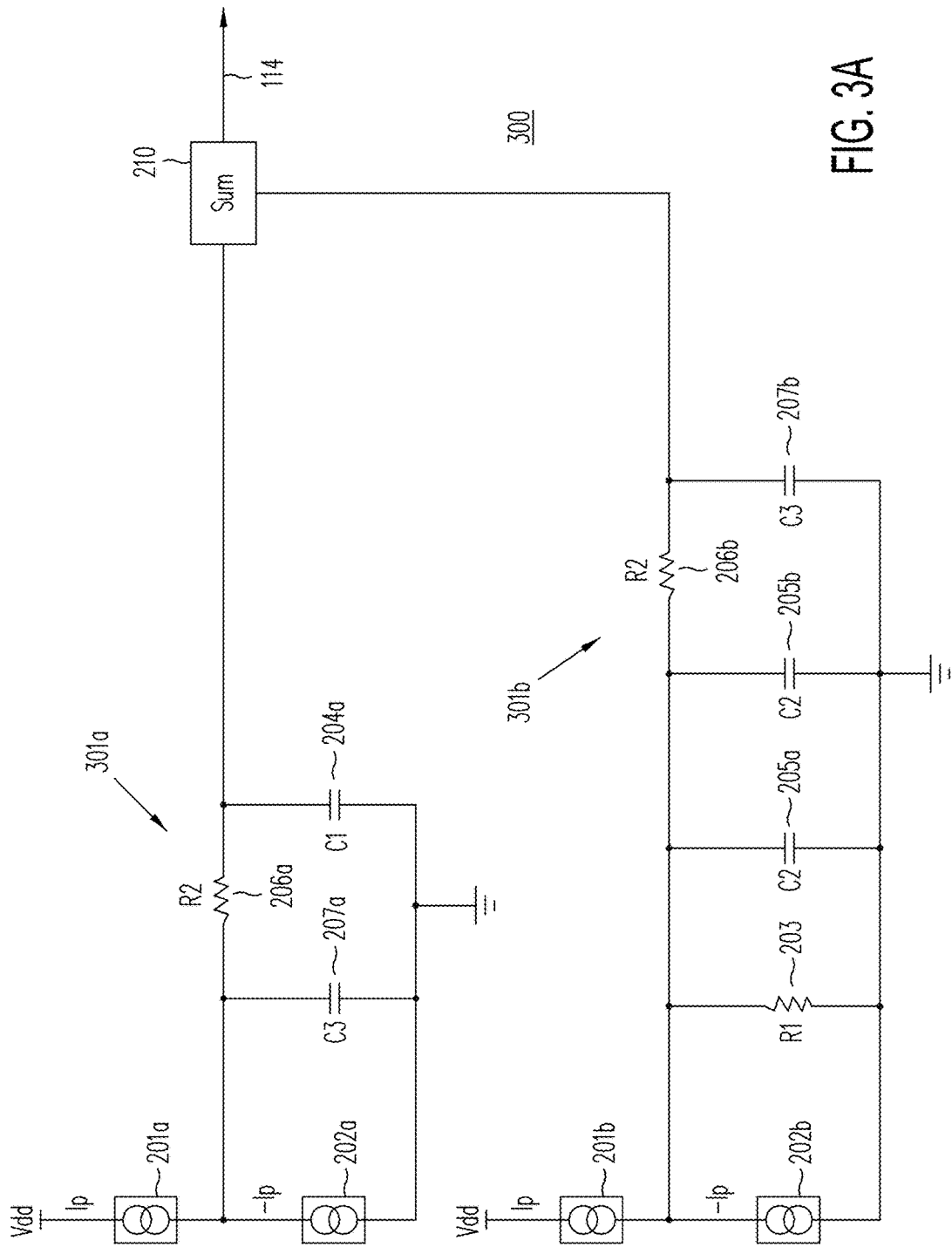
FIG. 3A shows network 300 which has a transfer function equivalent to implementation 200 of FIG. 2, in accordance with one embodiment of the present invention.

FIG. 3A shows network 300 including networks 301a and 301b, which output signals 302a and 302b are summed in summing circuit 210 to provide output signal 114. Network 300 has a transfer function that is equivalent to the transfer function above, in accordance with one embodiment of the present invention. Network 300 is achieve by providing current sources 201 and 202 (currents $I_P$ and $-I_P$, respectively), resistor 206 ($R_2$) and capacitor 207 ($R_3$) in both networks 301a and 301b. For ease of reference, like components in networks 301a and 301b are given like reference numerals, but distinguished from each other by the subfixes "a" and "b" according to whether they appear in network 301a or network 301b, respectively. Resistor 203 ($R_1$) and capacitor 204 each provided on one network, namely, in network 301b and 301a, respectively. Capacitor 205 is duplicated in network 301b. Substituting implementation 200 by network 300 to implement charge pump 102 and loop filter 103 in phase-locked loop 100 achieves substantially the same result as implemented by implementation 200 of a FIG. 2, Current sources 201a, 201b, 202a and 202b each provide either current $I_P$ or current $-I_P$, as shown in FIG. 2. When detected phase signal 112 indicates that feedback signal 115 is to be sped up (i.e., voltage $V_{CNTL}$ at input signal 114 of voltage-controlled oscillator 104 is be increased), current sources 201a and 201b are turned on to each cause a current $I_P$ to flow into networks 301a and 301b of loop filter circuit 103, respectively, which charges capacitors 204a, 205a, 205b, 207a and 207b. Conversely, when detected phase signal 112 indicates that feedback signal 115 is to be slowed down (i.e., voltage $V_{CNTL}$ at input signal 114 of voltage-controlled oscillator 104 is be decreased), current sources 202a and 202b are turned on to cause a current $-I_P$ in each of networks 301a and 301b to flow out of loop filter circuit 103, which discharge capacitors 204a, 205a, 205b, 207a and 207b. (There are many ways to turn on current source 201a, current source 201b, current source 202a or current source 202b, or to allow the current from any of the current sources to flow into or out of loop filter 103. To simplify this description, a detailed discussion of such ways, being conventional techniques known to those of ordinary skill in the art, is omitted). One method is to provide a switch between each current source and an input terminal of loop filter 103, with the switch being controlled by a control signal derived from detected phase signal 112.

Figure 1:
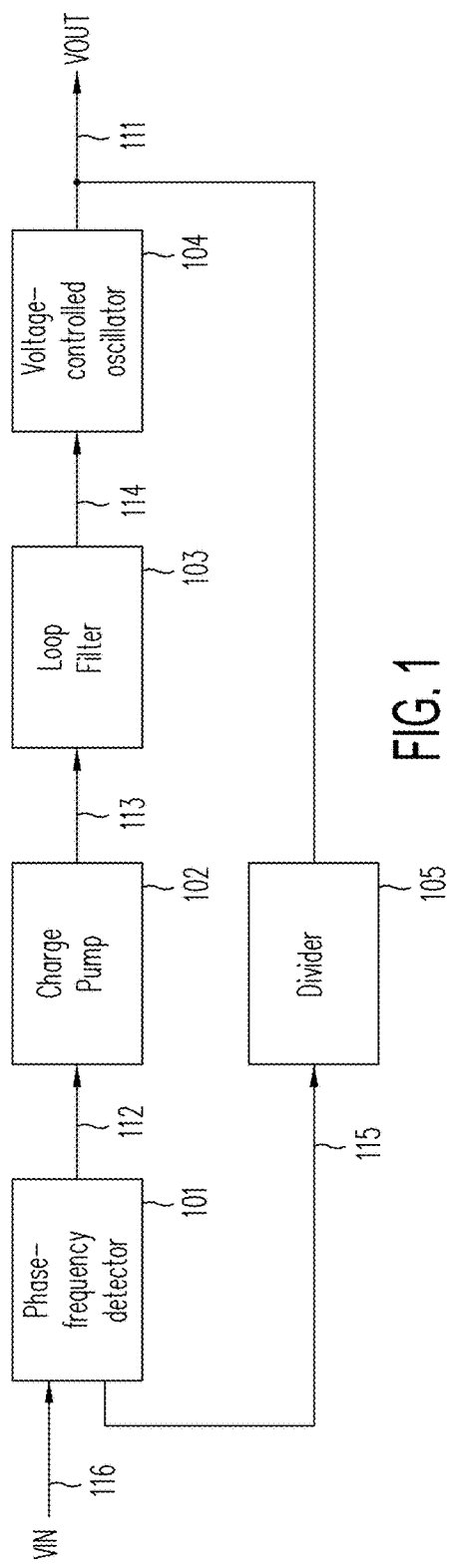
FIG. 1 shows a block diagram of a phase-locked loop 100.

The inventors also observe that a network (e.g., each of network 301a and 301b) may be scaled by any factor k (i.e, dividing each current source and each capacitive component by k and multiplying each resistive component by k) without substantially changing the resulting transfer function. Thus, in implementation 200, reducing the capacitance value $C_1$ and increasing resistance $R_1$ by the same factor does not change cut-off frequency $\omega_z$ of loop filter circuit 103 of FIG. 1. That is, $$\omega_Z = \frac{1}{2\pi R_1 C_1} = \frac{1}{2\pi k R_1 \frac{C_1}{k}}$$

Figure 3B:
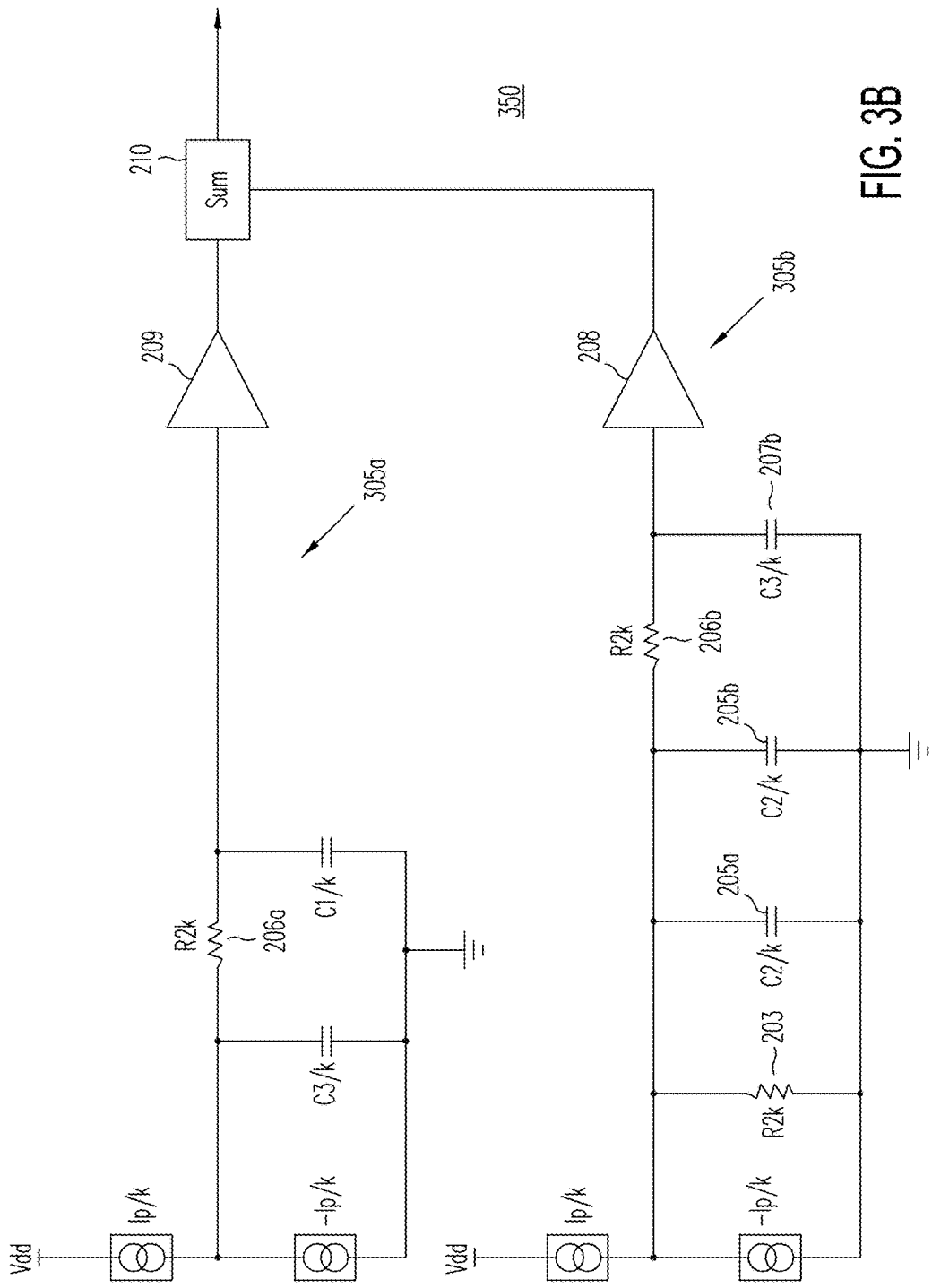
FIG. 3b shows network 350, which includes network 305a and 305b, being scaled from network 301a and 301b, respectively, in accordance with one embodiment of the present invention.

In an integrated circuit, as a smaller capacitor requires proportionally less area than a larger capacitor, and a larger resistor requires proportionally more area than a smaller resistor, a trade-off between resistor and capacitor sizes is available when implementing a RC filter circuit. FIG. 3b shows network 350, which includes networks 305a and 305b, each being scaled from network 301a and 301b by a factor k, respectively, in accordance with one embodiment of the present invention. The factor k may be, for example, any value between 5.0 and 10.0. Using the resistance values and capacitance values of implementation 200 as an example, by a scaling factor of k=5, the required transfer function is implemented by having $R_1$ and $R_2$ are each 50 kΩ, a typical values for $C_1$ is 20 pF, and typical values for $C_2$, and $C_3$ are each 2 pF.

As result, phase-locked loop 100 may be implemented using 50% less area than in the prior art. Furthermore, because the lower circuit area, noise (and hence, jitter) in the phase-locked loop is observed to be 20 dB lower than the prior art.

Figure 4:
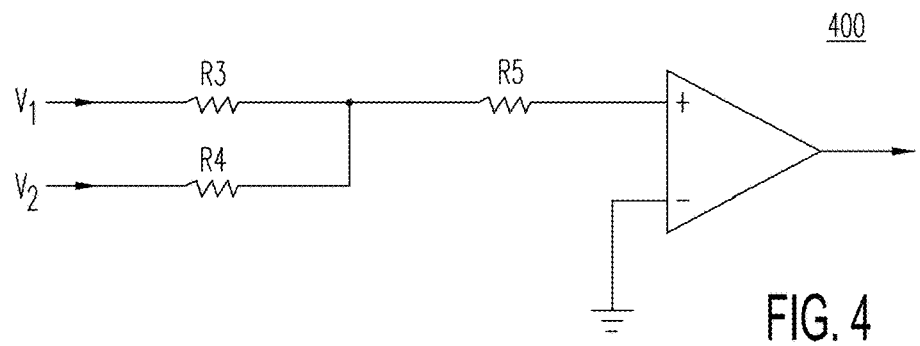
FIG. 4 shows voltage mode summing circuit 400.
Figure 5:
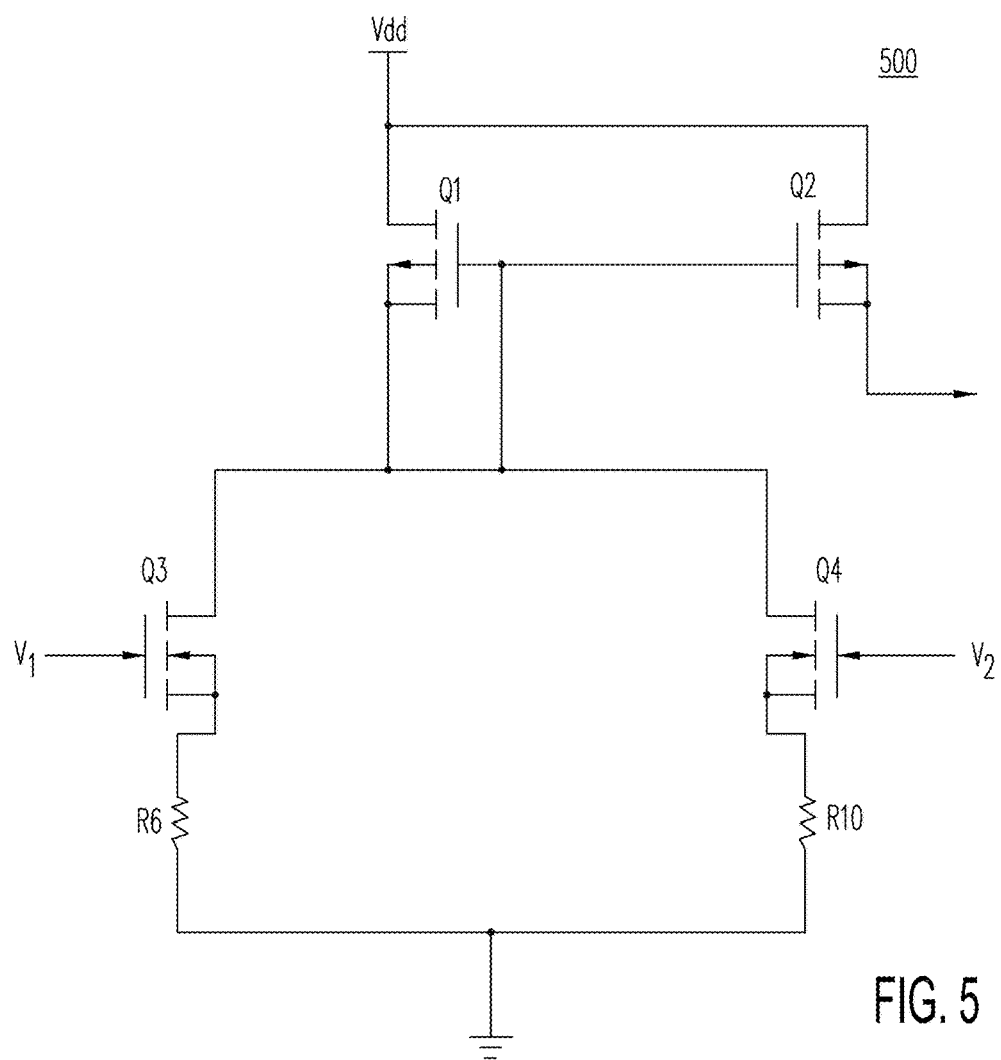
FIG. 5 shows current mode summing circuit 500.

Summing circuit 210 may be implemented by either voltage mode summing circuit 400 of FIG. 4 or, alternatively, current mode summing circuit 500 of FIG. 5, as known to those of ordinary skill in the art.

The detailed description above is provided to illustrate specific embodiments of the present invention and is not intended to be limiting. Various modifications and variations within the scope of the present invention are possible. The present invention is set forth in the accompanying claims.

I claim:

1. A phase-locked loop circuit receiving an input signal and an output signal, comprising:

a phase frequency detector which receives the input signal and a feedback signal, the feedback signal being derived from the output signal of the phase-locked loop, and which provides a phase-difference signal indicating a difference in phase or frequency between the input signal and the feedback signal;

a voltage controlled oscillator which receives a control signal and which provide the output signal of the phase-locked loop according to the control signal;

first and second charge pump-filter circuits each receiving the phase difference signal and each comprising:

a charge pump circuit which provide a predetermined signal in accordance with the phase difference signal; and a filter circuit receiving the predetermined signal to provide a filtered signal, the filter circuit comprising one or more resistors and one or more capacitors; and a summing circuit which sums the filtered signal of the first charge pump-filter circuit and the filtered signal of the second charge pump-filter circuit to provide the control signal, wherein the first and second charge-pump-filter circuits and the summing circuit together implement a transfer function that has at least a zero of:

$$H(s) = \frac{(1 + sR_1C_1)}{(s^2C_2C_3 + sC_1)(1 + sR_2C_3)}$$

in which $R_1$, $R_2$, C1, $C_2$ and $C_3$ are values of resistors and capacitors in the first and second charge-pump-filter circuits.

2. The phase-locked loop circuit of claim 1, wherein the charge pump circuit in each of the charge pump-filter circuits comprises a first current source providing a first predetermined current from a power supply voltage source and a second current source sinking a second predetermined current to a ground voltage.

3. The phase-locked loop circuit of claim 1, wherein the first and second charge-pump-filter circuit and the summing circuit together implement the transfer function of a conventional charge pump circuit and a conventional loop filter circuit.

4. The phase-locked loop of claim 1, wherein the summing circuit comprises a voltage mode summing circuit.

5. The phase-locked loop of claim 1, wherein the summing circuit comprises a current mode summing circuit.

* * * * *